(12) United States Patent
Yamaguchi

(10) Patent No.: US 8,147,100 B2
(45) Date of Patent: Apr. 3, 2012

(54) LIGHTING DEVICE

(75) Inventor: Hiroshi Yamaguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 62 days.

(21) Appl. No.: 12/753,307

(22) Filed: Apr. 2, 2010

(65) Prior Publication Data
US 2010/0254145 A1 Oct. 7, 2010

(30) Foreign Application Priority Data

Apr. 3, 2009 (JP) .................................. 2009-091001

(51) Int. Cl.
*F21V 5/04* (2006.01)
(52) U.S. Cl. ..................... 362/311.02; 362/555; 362/335
(58) Field of Classification Search .................. 362/555, 362/310, 311.02, 335
See application file for complete search history.

(56) References Cited

U.S. PATENT DOCUMENTS

| 7,348,723 | B2 | 3/2008 | Yamaguchi et al. | |
| 7,422,347 | B2* | 9/2008 | Miyairi et al. | ................. 362/335 |
| 7,474,475 | B2 | 1/2009 | Paek et al. | |
| 7,572,036 | B2 | 8/2009 | Yoon et al. | |
| 7,602,559 | B2* | 10/2009 | Jang et al. | ...................... 359/726 |
| 7,621,657 | B2* | 11/2009 | Ohkawa | .................... 362/311.01 |
| 7,880,188 | B2* | 2/2011 | Blumel et al. | .................... 257/98 |
| 2007/0187705 | A1 | 8/2007 | Tanaka et al. | |
| 2008/0303757 | A1* | 12/2008 | Ohkawa et al. | .................. 345/82 |
| 2009/0032827 | A1 | 2/2009 | Smits | |
| 2010/0195335 | A1* | 8/2010 | Allen et al. | .................... 362/309 |
| 2010/0238669 | A1* | 9/2010 | Holder et al. | ............. 362/311.02 |

FOREIGN PATENT DOCUMENTS

| JP | 2006-92983 | 4/2006 |
| JP | 2006-114863 | 4/2006 |
| JP | 2007-34307 | 2/2007 |

* cited by examiner

*Primary Examiner* — Peggy A. Neils
(74) *Attorney, Agent, or Firm* — Hamre, Schumann, Mueller & Larson, P.C.

(57) ABSTRACT

A lighting device includes a substrate, a LED element, and a lens. A light exit surface of the lens includes a first light exit surface and a second light exit surface. A curve obtained by cutting the light exit surface by a plane including the optical axis has, on a boundary between the first light exit surface and the second light exit surface, a change point at which a rate of inclination decreases discontinuously. An angle between the optical axis and a line segment connecting the change point and a light emission center of the LED element is approximately equal to an emission angle with the highest light intensity, among emission angles, when light rays emitted from the light exit surface are sorted by respective emission angles.

3 Claims, 4 Drawing Sheets

LIGHTING DEVICE

BACKGROUND OF THE INVENTION

1. Field of the Invention

The present invention relates to a lighting device to be used suitably in, for example, a backlight of a liquid crystal display.

2. Description of Related Art

In recent years, with a remarkably enhanced efficiency and reduced cost of light emitting diodes (LEDs), LEDs have replaced conventional fluorescent tubes as dominant light sources for backlights of small and medium-sized liquid crystal displays, and further are gaining widespread use as light sources for large-screen liquid crystal displays or for general illumination.

In large-screen liquid crystal displays like liquid crystal TVs, direct type backlights have been used widely instead of edge light type backlights, which are commonly used in small and medium-sized liquid crystal displays. This is because such edge light type backlights have the following disadvantages.

An edge light type backlight is configured such that a light source is disposed at a lateral side of a light guide plate and optical films such as a prism sheet and a diffusing sheet further are disposed on the light emission side of the light guide plate. This configuration enables a reduction in the thickness of a display. On the other hand, in a large screen display, with an increase in the diagonal screen size, the required light quantity as well as the area of the display increase quadratically. However, the length of the lateral side, on which the light source can be disposed, increases linearly. As the screen size increases, the required light quantity density increases, which makes it more difficult to position the light source, and the heat generation density also increases, which makes it more difficult to dissipate the heat.

In that respect, since a direct type backlight is configured such that a large number of light sources are disposed in a plane beneath a liquid crystal panel and a diffusing plate and optical films such as a prism sheet and a diffusing film are disposed between the light sources and the liquid crystal panel, the required light quantity density does not change even when the screen size increases. Therefore, the heat generation density also remains unchanged, which is suitable for large screens.

In the case where an illumination of a flat surface with the above-mentioned direct type backlight or a desk lamp is performed by using approximate point light sources like LED light sources, when an angle from a perpendicular drawn from a light source to a flat surface to be illuminated is $\theta$, and an intensity of light emitted in the $\theta$ direction is $K(\theta)$, the illuminance $L(\theta)$ at a point intersected by the illuminated surface in the $\theta$ direction is represented by the following equation:

$$L(\theta)=A \times K(\theta) \times \cos^3(\theta) \quad \text{(Equation 1)}$$

where A is a constant that depends on the distance from the light source to the illuminated surface.

Generally, a LED light source includes a LED element mounted on a substrate and a transparent resin that encapsulates the LED element. That is, the transparent resin forms a lens. When the encapsulating resin is formed in a hemispherical shape having its center at the LED element, the light emitted therefrom exhibits substantially Lambertian distribution. The Lambertian distribution is a light distribution characteristic such that a light ray emitted in the optical axis direction has the highest intensity K0 and a light ray emitted in a direction at an angle of $\theta$ with respect to the optical axis has a relative emission intensity $K(\theta)/K0$ of $\cos(\theta)$.

When a flat surface is illuminated using such a Lambertian light source, the illuminance on the surface is represented by the following equation by substituting $K(\theta)=K0 \times \cos(\theta)$ in Equation (1):

$$L(\theta)=A \times K0 \times \cos^4(\theta)$$

Here, since the illuminance L0 in the optical axis direction is $A \times K0$, the relative illuminance distribution $L(\theta)/L0$ normalized with respect to the illuminance L0 in the optical axis direction is represented by the following equation:

$$L(\theta)/L0=\cos^4(\theta)$$

FIG. 3 shows the relative illuminance distribution.

As shown in FIG. 3, the illuminance on the illuminated surface decreases sharply with increasing angle. Here, when the distance from the light source to the illuminated surface is D, the angle $\theta$ of light emitted to a position on the surface with a distance x from the optical axis is represented by the following equation:

$$\tan(\theta)=x/D$$

Accordingly, if the horizontal axis of the graph of FIG. 3 is redefined as the distance $x=D \times \tan(\theta)$, the resulting graph indicates the spatial illuminance distribution, in which the position on the optical axis is brightest and becomes darker suddenly with increasing distance from the optical axis.

Since the LED light sources used for a direct type backlight are required to have a characteristic of illuminating a largest possible area uniformly with a smallest possible number of LED light sources, the characteristic as mentioned above is not desirable for such a backlight. The characteristic of illuminating a specific area uniformly may be effective for use in, for example, a desk lamp, etc., in addition to a backlight.

The condition for illuminating a flat surface uniformly using a single point light source is that the right-hand side of Equation 1 has a constant value L0 irrespective of the angle $\theta$, that is, the following equation is satisfied.

$$A \times K(\theta) \times \cos^3(\theta)=L0$$

By transforming the above equation, the following equation is obtained:

$$K(\theta)=L0/A \times \cos^{-3}(\theta)$$

In the above equation, L0/A is the light intensity at the angle $\theta$ of 0 degree, that is, the axial light intensity. The light distribution characteristic for achieving a uniform illuminance distribution is obtained when the relative light intensity distribution $K(\theta)/K0$ normalized with respect to the axial light intensity K0 satisfies following equation:

$$K(\theta)/K0=\cos^{-3}(\theta) \quad \text{Equation (2)}$$

FIG. 4 shows the emitted light intensity distribution.

As is clear from FIG. 4, the light intensity required for the uniform illumination increases sharply with increasing angle. Therefore, it is impossible to satisfy the above Equation 2 in the entire range of angles from −90 degrees to +90 degrees, and thus the goal is to obtain the characteristic similar to the characteristic represented by Equation 2 in as wide a range as possible.

For this goal, various shapes of encapsulating transparent resins have been proposed to improve the light distribution characteristics by utilizing the refraction and reflection at the surfaces of the encapsulating transparent resins. For example, JP 2006-092983 A discloses a shape of an encapsulating resin having a concave around the optical axis and a convex extending outwardly from the concave.

It is, however, not easy to obtain the characteristic of increasing the emitted light intensity sharply with increasing angle as shown in FIG. 4. In particular, the difficulty of obtaining the above-mentioned characteristic increases further if a LED of limited size and an encapsulating resin of limited size are used.

SUMMARY OF THE INVENTION

In view of the above problems, it is an object of the present invention to provide a lighting device capable of achieving the characteristic of increasing the emitted light intensity sharply with increasing light emission angle in a simple way.

In order to solve the above-mentioned problems, the lighting device of the present invention includes: a substrate; a LED element mounted on the substrate; and a lens disposed on the substrate so as to cover the LED element. The lens has a light exit surface that is rotationally symmetric with respect to an optical axis. In this lighting device, the light exit surface includes a first light exit surface that extends from the optical axis, and a second light exit surface that leads from a periphery of the first light exit surface to the substrate, and a curve obtained by cutting the light exit surface by a plane including the optical axis has, on a boundary between the first light exit surface and the second light exit surface, a change point at which a rate of inclination decreases discontinuously. An angle between the optical axis and a line segment connecting the change point and a light emission center of the LED element is approximately equal to an emission angle with the highest light intensity, among emission angles that are angles between light rays emitted from the light exit surface and the optical axis, when the light rays are sorted by respective emission angles.

As stated herein, the "rate of inclination" is a rate of increase in the height of a point on the light exit surface (distance from the substrate to the point) with respect to an increase in the distance of the point from the optical axis. The phrase "approximately equal to" means that a difference between the angles is 5 degrees or less.

According to the lighting device of the present invention, the characteristic of increasing the emitted light intensity sharply with increasing light emission angle is obtained, which makes it possible to illuminate a larger area with a nearly uniform illuminance. Therefore, when the lighting device of the present invention is used in a backlight of a liquid crystal display it is expected to contribute to a reduction in the thickness of the display.

DETAILED DESCRIPTION OF THE INVENTION

Hereinafter, embodiments of the present invention will be described with reference to the accompanying drawings.

Figure 1:
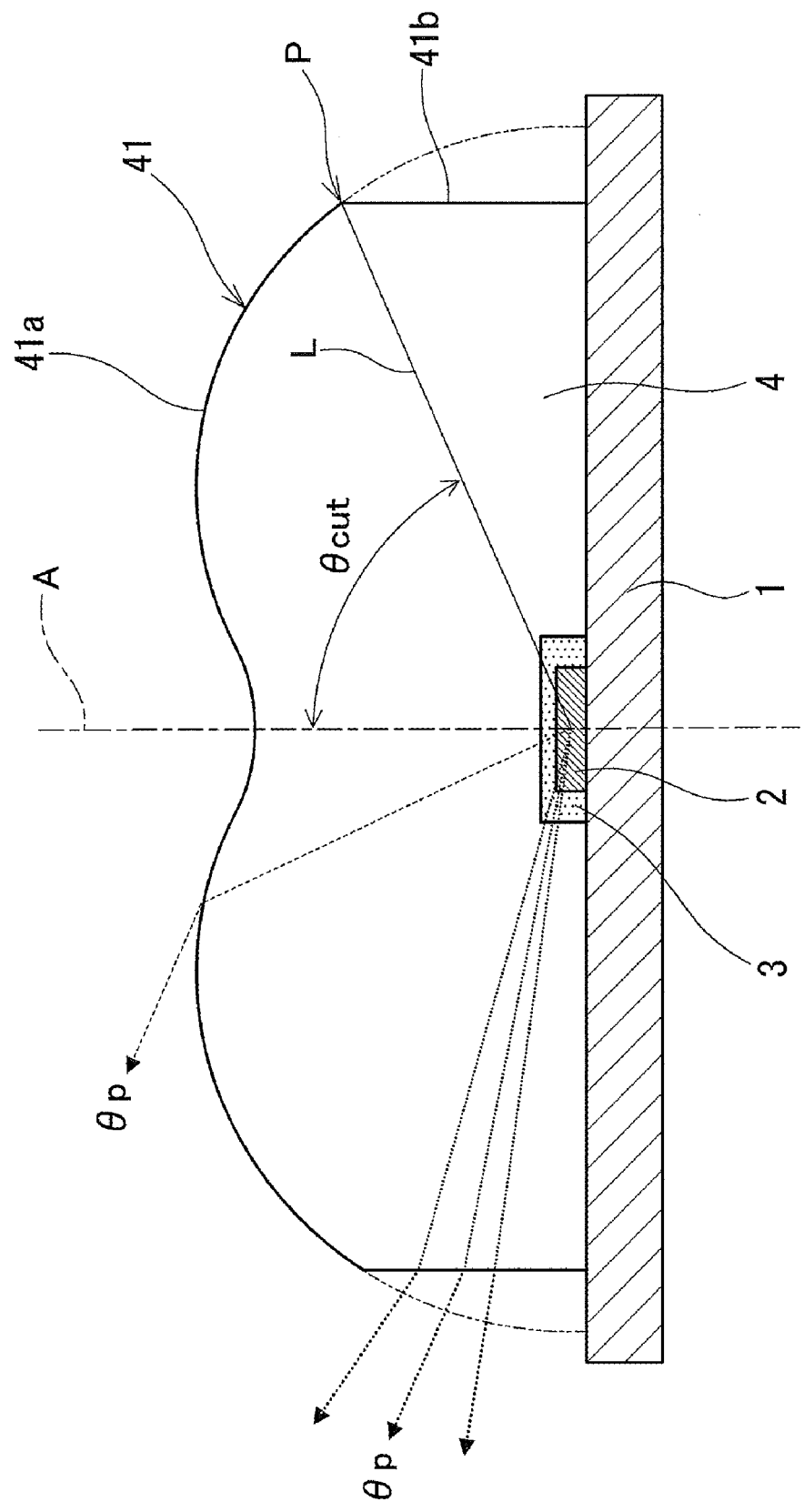
FIG. 1 is a cross-sectional view of a lighting device according to one embodiment of the present invention.

FIG. 1 is a cross-sectional view of a lighting device (surface illumination device) according to one embodiment of the present invention. This lighting device includes a mounting substrate 1, a LED element 2 mounted on the mounting substrate 1, and a lens 4 disposed on the mounting substrate 1 so as to cover the LED element 2.

In the present embodiment, a blue LED chip is used as the LED element 2. A phosphor layer 3 for converting blue light into yellow light is provided around the LED element 2 so as to encompass the LED element 2 from the side opposite to the mounting substrate 1.

Furthermore, in the present embodiment, the LED element 2 and the phosphor layer 3 are encapsulated with transparent resin, and this transparent resin forms a lens 4. When the encapsulation with the transparent resin is performed, the surface of the transparent resin, which is to be an interface with air, is molded in a mold into a specific shape so as to form a light exit surface (light distribution control surface) 41 that is rotationally symmetric with respect to the optical axis A. Examples of the transparent resin include epoxy resin, silicone resin, acrylic resin, and polycarbonate. The lens 4 also may be formed of silicone rubber or the like. The light exit surface 41 of the lens 4 need not be completely rotationally symmetric, and it may be substantially rotationally symmetric.

A part of blue light emitted from the LED element (blue LED chip) 2 passes through the phosphor layer 3 and the other part of the light is converted into yellow light by the action of the phosphor. As a result, white light is emitted from the phosphor layer 3. The white light emitted from the phosphor layer 3 enters the lens 4, is refracted at the light exit surface 41 according to its incident angle with respect to the light exit surface 41, and then emitted from the light exit surface 41 in a specific direction.

The shape of the light exit surface 41 is obtained in the following manner. First, a continuous surface represented in a specific functional form is designed so that its light distribution is approximated to a target light distribution, and then the resulting continuous surface is cut by a cylindrical surface having its center on the optical axis A (in FIG. 1, the shape of the continuous surface to be cut is indicated by double-dashed lines). That is, the light exit surface 41 includes a first light exit surface 41a that extends from the optical axis A, and a second light exit surface 41b that leads from the periphery of the first light exit surface 41a to the mounting substrate 1 along the optical axis direction in which the optical axis A extends. The first light exit surface 41a of the present embodiment has a concave around the optical axis A and a convex that extends outwardly from the concave. On the other hand, the second light exit surface 41b is a cylindrical surface. A curve obtained by cutting the light exit surface 41 by a plane including the optical axis A has, on the boundary between the first light exit surface 41a and the second light exit surface 41b, a change point P at which a rate of inclination decreases discontinuously.

The first light exit surface 41a and the second light exit surface 41b need not necessarily be connected to each other to form a clear ridge line therebetween. For example, the first light exit surface 41a and the second light exit surface 41b may be connected to each other to form a sharp curve (for example, a curve with a curvature radius of about 1 mm) therebetween. That is, the rate of inclination from the first light exit surface 41a to the second light exit surface 41b has only to decrease substantially discontinuously at the change point P.

A position where the continuous surface is cut is a point of intersection of the continuous surface and a straight line extending from the light emission center of the LED element 2 at an angle θcut with respect to the optical axis A. The above angle θcut is determined so that it coincides substantially with the emission angle θp with the maximum light intensity in the previously designed continuous surface. As stated herein, the "emission angle" is each of angles between light rays emitted from the lens 4 and the optical axis A. The "emission angle with the maximum light intensity" is an emission angle with the light highest intensity, among emission angles, when light rays emitted from the continuous surface are sorted by respective emission angles.

As a result of cutting the continuous surface as described above, an angle between the optical axis A and a line segment connecting the change point P and the light emission center of the LED element 2 becomes equal to the above angle θcut. Since this angle θcut is substantially equal to the above angle θp, the angle θcut also is approximately equal to the emission angle with the highest light intensity, among emission angles, when light rays emitted from the light exit surface 41 are sorted by respective emission angles.

Figure 2:
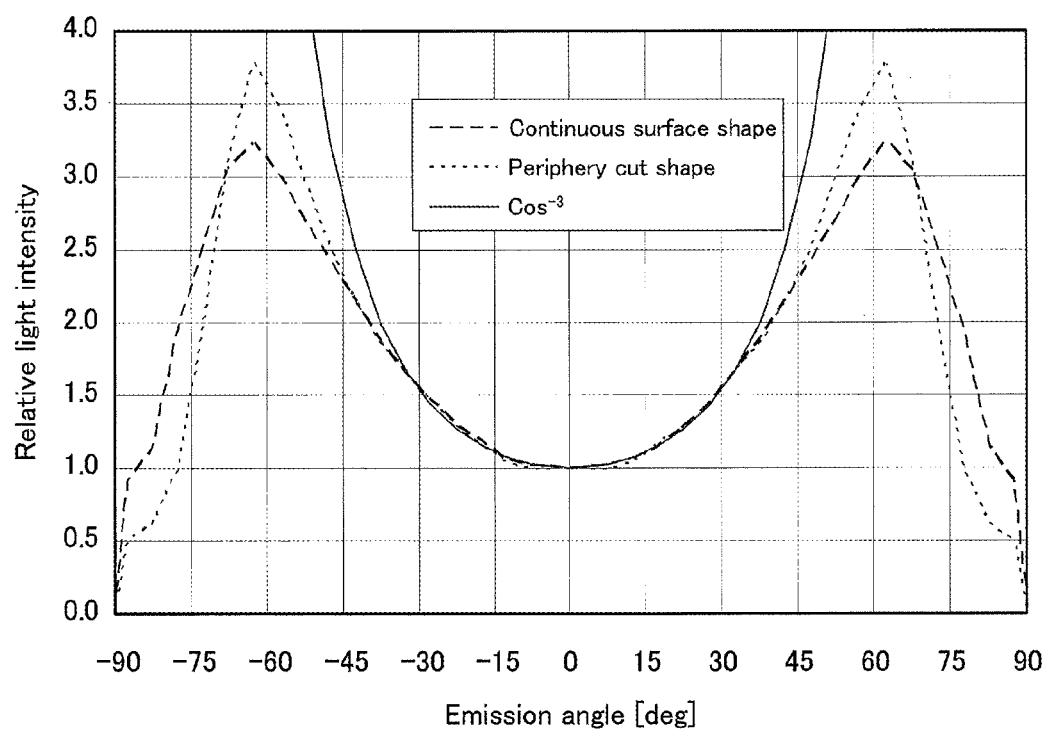
FIG. 2 is a graph showing the light distribution characteristics of the lighting device of FIG. 1.
Figure 3:
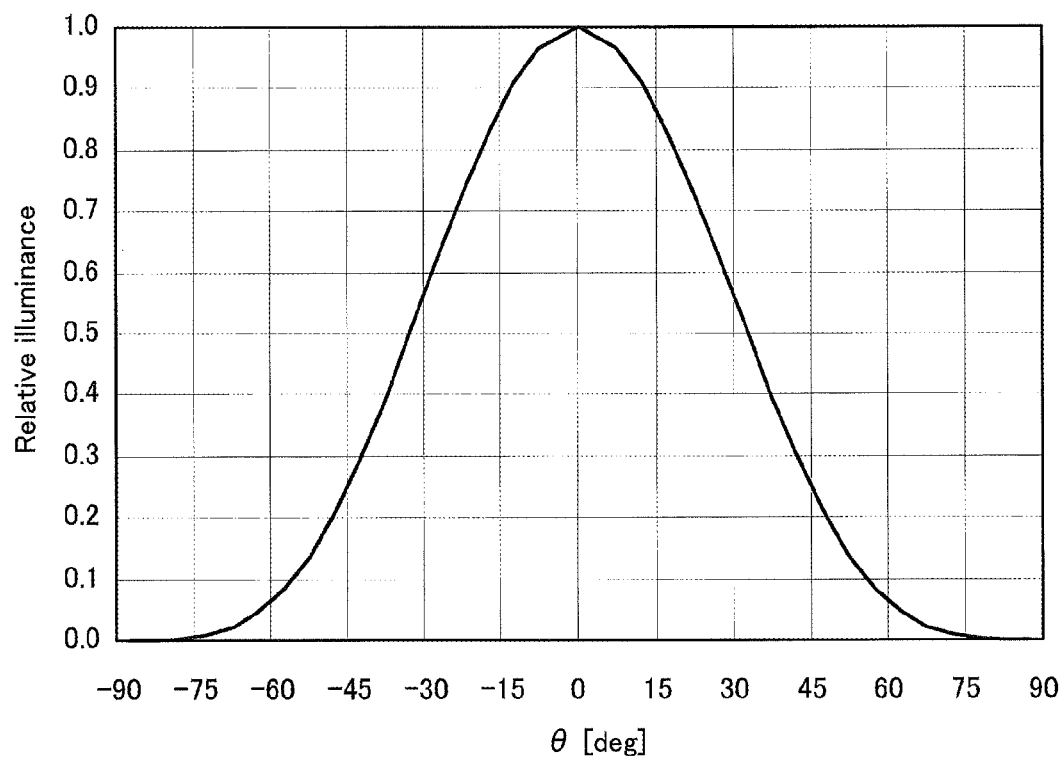
FIG. 3 is a graph showing the illuminance distribution obtained when a Lambertian light source is used.
Figure 4:
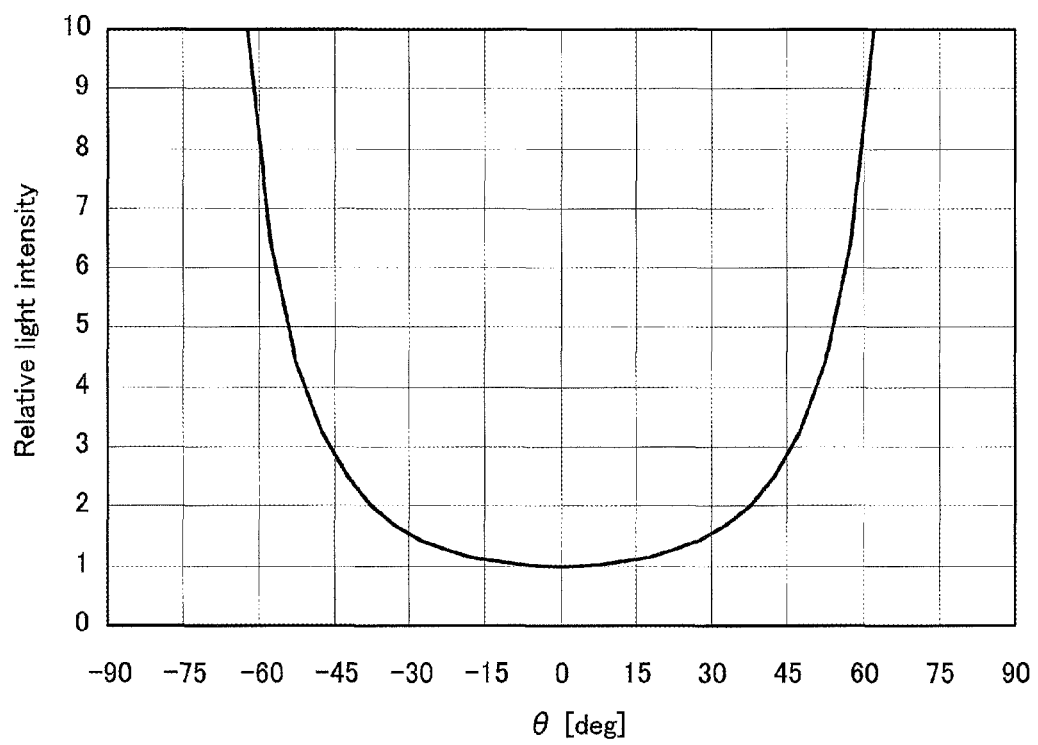
FIG. 4 is a graph showing a condition for illuminating a flat surface with a uniform illuminance by using a single light source.

FIG. 2 is a graph showing the light distribution characteristics obtained by the previously designed continuous surface shape, and the light distribution characteristics obtained by the final shape formed by cutting the continuous surface by the cylindrical surface, that is, the light distribution characteristics of the lighting device of the present embodiment. In FIG. 2, the horizontal axis indicates the emission angles of light rays emitted from the lighting device, and the vertical axis indicates the relative light intensities obtained by normalizing the intensities of the light rays emitted in these angle directions with respect to the intensity in the optical axis direction.

As is apparent from FIG. 2, the final shape formed by cutting the continuous surface by the cylindrical surface exhibits the following light distribution characteristics, compared with the previously designed continuous surface shape. That is, the peak intensity in the θp direction increases, and the emitted light intensity also increases sharply with an increase in the emission angle near the angle of θp. Thus, the resulting curve approaches more closely the curve of the uniform illumination condition of $Cos^{-3}(\theta)$.

This is because the light rays incident on the cut cylindrical surface (second light exit surface 41b) are refracted in and around the θp direction as shown by dotted lines in FIG. 1, which increases the luminous flux density in and around the θp direction. That is, light rays having the emission angle of θp include not only a light ray emitted from the first light exit surface 41a but also a light ray emitted from the second light exit surface 41b.

In the above example, the second light exit surface 41b, which is a cylindrical surface, is formed by cutting a continuous surface with a cylindrical surface having its center on the optical axis A. The effect of increasing the peak light intensity in the θp direction can be expected as long as the light exit surface 41 has a shape capable of decreasing the rate of inclination discontinuously at a position in or around the θp direction from the light emission center of the LED element 2. For example, the second light exit surface 41b may be a tapered surface extending radially toward the mounting substrate 1. In the case where the second light exit surface 41b is a tapered surface, it is preferable that the angle with respect to the optical axis A be, for example, 10 degrees or less so that the second light exit surface 41b leads from the periphery of the first light exit surface 41a to the mounting substrate 1 along the optical axis direction.

In the above example, white light is obtained using a blue LED and a phosphor; but the present invention is not limited to this configuration. For example, it also is possible to obtain a white light source by placing LEDs of three primary colors, red, green, and blue, closely to one another near the optical axis and forming a lens to cover these LEDs. A white surface light source may be obtained by preparing a plurality of single color light sources, each including a red, green or blue LED and a lens that covers the LED, are placed in a plane so that light rays from the light sources are mixed on a surface to be illuminated.

Such a configuration makes it possible to obtain easily the characteristic of increasing the emitted light intensity sharply with increasing light emission angle.

The present invention makes it possible to illuminate a larger area of a target surface almost uniformly. Accordingly, when the present invention is used as a light source for backlights of liquid crystal displays, the thickness of the resulting device can be reduced and uneven illumination also can be reduced.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A lighting device comprising:
   a substrate;
   a LED element mounted on the substrate; and
   a lens disposed on the substrate so as to cover the LED element, the lens having a light exit surface that is rotationally symmetric with respect to an optical axis,
   wherein the light exit surface includes a first light exit surface that extends from the optical axis, and a second light exit surface that leads from a periphery of the first light exit surface to the substrate, and a curve obtained by cutting the light exit surface by a plane including the optical axis has, on a boundary between the first light exit surface and the second light exit surface, a change point at which a decreasing slope of the first light exit surface and a slope of the second light exit surface are discontinuous, and
   an angle between the optical axis and a line segment connecting the change point and a light emission center of the LED element is approximately equal to an emission angle with the highest light intensity, among emission angles that are angles between light rays emitted from the light exit surface and the optical axis, when the light rays are sorted by respective emission angles.

2. The lighting device according to claim 1, wherein the lens is made of transparent resin.

3. The lighting device according to claim 1, wherein the second light exit surface is a cylindrical surface or a tapered surface.

* * * * *